United States Patent
Reohr et al.

(10) Patent No.: US 6,404,671 B1
(45) Date of Patent: Jun. 11, 2002

(54) DATA-DEPENDENT FIELD COMPENSATION FOR WRITING MAGNETIC RANDOM ACCESS MEMORIES

(75) Inventors: William Robert Reohr, Chappaqua, NY (US); Roy Edwin Scheuerlein, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/933,584

(22) Filed: Aug. 21, 2001

(51) Int. Cl.[7] .............................................. G11C 11/00
(52) U.S. Cl. ........................ 365/158; 365/171; 365/173
(58) Field of Search ................................ 365/158, 171, 365/173

(56) References Cited

U.S. PATENT DOCUMENTS

| | | | |
|---|---|---|---|
| 6,005,800 A | | 12/1999 | Koch et al. ................. 365/173 |
| 6,252,471 B1 | * | 6/2001 | Salter et al. ................ 365/158 |
| 6,256,471 B1 | * | 7/2001 | Perner et al. ............... 365/171 |
| 6,317,376 B1 | * | 11/2001 | Tran et al. .................. 365/158 |

* cited by examiner

*Primary Examiner*—Trong Phan
(74) *Attorney, Agent, or Firm*—Marian Underweiser; Ryan, Mason & Lewis, LLP

(57) ABSTRACT

A field compensation circuit for selectively writing one or more selected magnetic memory cells in a magnetic random access memory (MRAM) includes a controller for detecting a characteristic representative of an anticipated interaction between a magnetic field emanating from a bit line corresponding to a selected memory cell and at least one stray magnetic field emanating from one or more bit lines associated with one or more memory cells in close relative proximity to the selected memory cell. A control signal generated by the controller is indicative of the detected characteristic. The field compensation circuit further includes a programmable current source operatively coupled to the bit line corresponding to the selected memory cell, the programmable current source including an input for receiving the control signal. The programmable current source generates a write current having a magnitude which varies in response to the control signal. In this manner, the write current flowing through a given bit line corresponding to a selected memory cell can be selectively adjusted to compensate for magnetic field interaction with adjacent bit lines.

20 Claims, 7 Drawing Sheets

DATA-DEPENDENT FIELD COMPENSATION FOR WRITING MAGNETIC RANDOM ACCESS MEMORIES

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

The present invention relates generally to random access memory systems, and more particularly relates to an architecture for improving a write margin within a magnetic random access memory (MRAM) device.

BACKGROUND OF THE INVENTION

Thin film MRAM has been investigated since the early 1950s. However, as described in the text "Computer Storage Systems and Technology," by Richard E. Matick, John Wiley & Sons (1977), which is incorporated herein by reference, these memories were deemed to be impractical due to narrow write and read margins which eroded as device dimensions were scaled. Recently, a renewed interest in MRAM has been sparked by its application to the nonvolatile memory market. New memory devices, such as a magnetic tunnel junction (MTJ) device, which exhibits magneto resistance, overcame an earlier obstacle of inductive sensing. As summarized in Scheuerlein et al., "A 10ns Read and Write Non-Volatile Memory Array Using a Magnetic Tunnel Junction and FET Switch in Each Cell," *ISSCC* 2000, pp. 128–129, desirable characteristics of MTJ-based memories include high integration density, high speed, low read power, and soft error rate (SER) immunity.

In conventional magnetoresistive memory architectures, writing individual memory cells without also writing adjacent or other non-intended cells remains a problem. Typically, writing an MTJ memory cell involves passing electrical currents simultaneously through a bit line (generally defined along a y axis) and word line (generally defined along an x axis) at the intersection of which the intended MTJ cell resides. Thus, selected cells in a thin film MRAM are written by the coincidence of x-oriented and y-oriented magnetic fields. The selected MTJ cell will experience a magnetic field which is the vector sum of the magnetic fields created by the word and bit line currents. All other MTJ cells that share the same bit line or word line as the selected MTJ cell will be half-selected and will thus be subjected to either bit line or word line magnetic fields, respectively. Since the magnitude of the vector sum of the word line and bit line fields is about forty-one percent (41%) larger than the individual word line or bit line fields, the write selectivity of a selected MTJ cell over half-selected MTJ cells is poor, especially when the non-uniform switching characteristics of the MTJ cells are considered.

Variations in the geometry (e.g., shape or size) of an MTJ cell can give rise to variations in magnetic thresholds of the MTJ cells which are so large that it is virtually impossible to write a selected cell without also arbitrarily switching some of the half-selected cells, thus placing the reliability and validity of the stored data in question. There may also be other factors, for example, related to manufacturing uncertainties and intrinsic magnetic material variability (e.g., temperature and processing variations) such that cell to cell magnetic response variations can be significantly large. This magnetic response variability from cell to cell adversely impacts the write select margin of the MRAM device. Additionally, the spontaneous switching of an MTJ cell when it is subjected to repeated magnetic field excursions much smaller than its nominal switching field, an effect known as "creep," narrows the acceptable write select margin even further thereby making the need for greater selectivity of individual MTJ cells even more imperative.

A write disturb is generally defined as an unintended alteration of the state of an unselected memory cell while a selected cell, which is targeted for a write operation, is written to a new state. The avoidance of write disturbs is a critical issue for thin film MRAM devices. In conventional thin film MRAM, selected memory cells are written by the coincidence of x-oriented and y-oriented magnetic fields, as stated above. Ideally, half-selected memory cells receive only one of the two fields, and the force of only one field on a magnetic memory cell is typically not enough to change the polarity, and therefore the state, of the cell. In practice, however, stray magnetic fields may combine to make a half-selected memory cell susceptible to write disturbs. This is an undesirable characteristic which is inherent in a conventional coincident x-y write scheme.

A major hurdle to the realization of practical sub-micron MRAM architectures has been the problem of write selectivity. The avoidance of write disturbs in thin film MRAM has, thus far, been unsuccessfully addressed in conventional magnetic memory architectures. There is a need, therefore, in the field of magnetic memory devices and systems for improved write selection techniques which can be readily adapted to a conventional MRAM architecture described above as well as other alternative magnetic memory architectures.

SUMMARY OF THE INVENTION

The present invention provides techniques for effectively writing memory cells in an MRAM device. Since the data being written to the adjacent memory cell is known, this data will produce a predictable magnetic field emanating from the corresponding bit line. By adjusting the write current in a first bit line in response to stray magnetic fields emanating from a second bit line which is adjacent to the first bit line, the write current in the first bit line, which furthermore connects to a selected memory cell, can be adjusted to compensate for the stray magnetic field interaction of the second bit line and thus more effectively write the selected memory cell.

In accordance with one aspect of the invention, a write circuit for writing a plurality of selected magnetic memory cells in a magnetic random access memory (MRAM) device comprises a controller for detecting a characteristic representative of an interaction between a magnetic field emanating from a bit line associated with a selected memory cell and at least one stray magnetic field emanating from one or more bit lines associated with one or more memory cells adjacent to the selected memory cell. The controller generates a control signal indicative of the detected characteristic. The write circuit further includes a current source operatively coupled to the bit line associated with the selected memory cell. The current source includes an input for receiving the control signal and generates a write current having a magnitude which varies in response to the control signal. In this manner, the write circuit effectively compensates for magnetic field interactions between adjacent memory cells in the memory array.

In accordance with another aspect of the invention, a method of adjusting the write current of a selected memory cell is provided. The method includes the step of detecting a characteristic which represents an interaction between a magnetic field emanating from a bit line associated with the selected memory cell and at least one stray magnetic field emanating from one or more bit lines associated with one or more memory cells adjacent to the selected memory cell. The method further includes the step of generating a control signal indicative of the detected characteristic and controlling at least a portion of a write current flowing through the bit line corresponding to the selected memory cell in response to the control signal.

These and other objects, features and advantages of the present invention will become apparent from the following detailed description of illustrative embodiments thereof, which is to be read in connection with the accompanying drawings, wherein like elements are designated by identical reference numerals throughout the several views.

DETAILED DESCRIPTION OF PREFERRED EMBODIMENTS

The present invention will be described herein in the context of an illustrative magnetic random access memory (MRAM) array. It should be appreciated, however, that the present invention is not limited to this or any particular magnetic memory array. Rather, the invention is more generally applicable to any magnetic memory device and/or architecture wherein it is desirable to provide an improved write margin. Moreover, although implementations of the present invention are described herein with reference to complementary metal-oxide-semiconductor (CMOS) devices and magnetic tunnel junction (MTJ) devices, it should be appreciated that the invention is not limited to such devices, and that other suitable devices, such as, for example, bipolar junction transistor (BJT) devices and other magnetic memory elements, such as, but not limited to, anisotropic magneto resistance (AMR) or giant magneto-resistance (GMR) memory cells, may be similarly employed, with or without modifications to the inventive memory architecture, as will be understood by those skilled in the art.

Figure 1A:
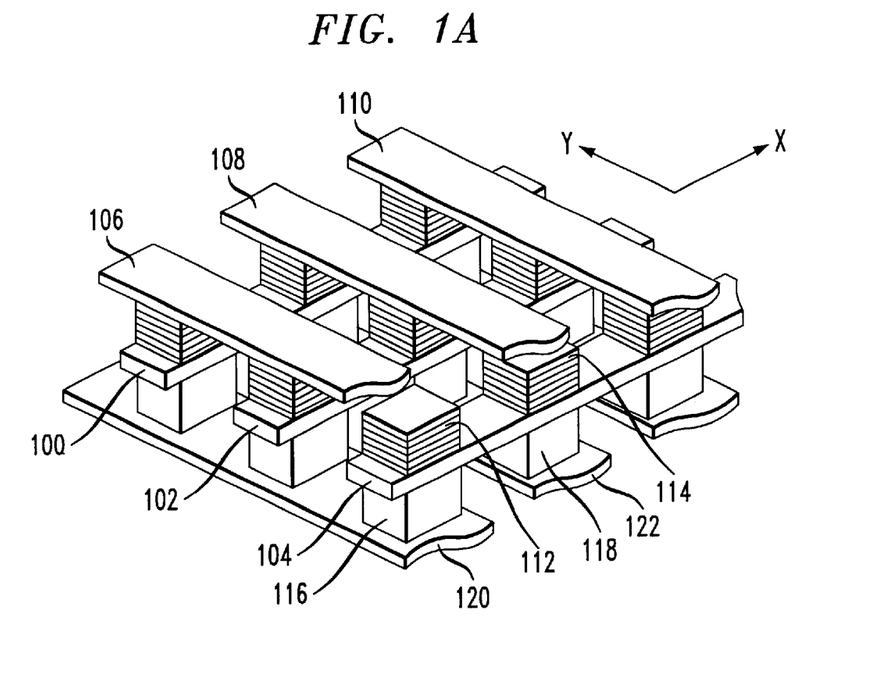
FIG. 1A depicts at least a portion of an MTJ-type MRAM array having magnetic memory cells disposed at intersecting regions of orthogonal word and bit lines.
Figure 1B:
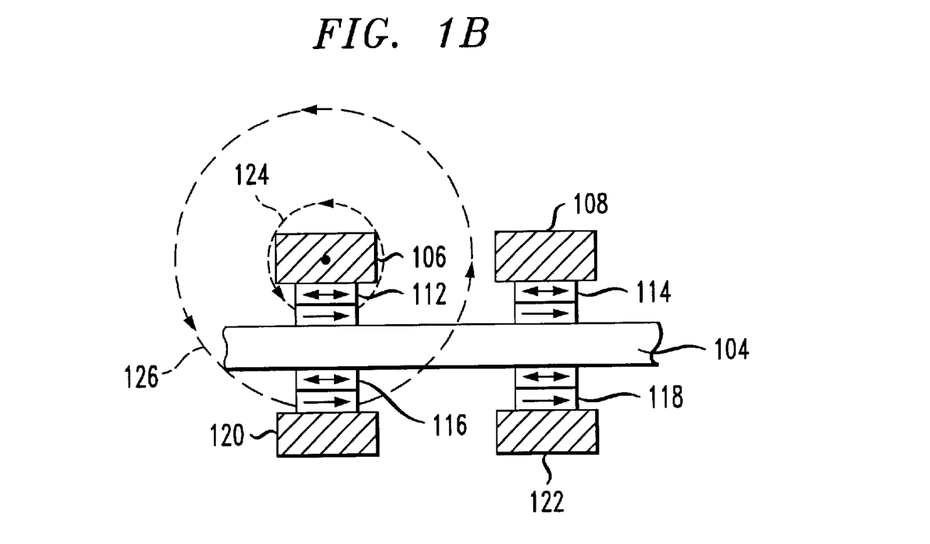
FIG. 1B is a cross-sectional view of a portion of the MRAM array shown in FIG. 1A illustrating an interaction of stray magnetic fields.

FIGS. 1A and 1B illustrate at least a portion of a conventional MRAM array, wherein a plurality of magnetic memory elements 112, 114 are disposed at intersecting regions of orthogonal electrically conductive word lines 100, 102, 104 and bit lines 106, 108, 110. Only three word lines and three bit lines are shown in FIG. 1A, although the number of lines in the MRAM would typically be much larger. As previously stated, a write disturb may be defined as an unintended alteration of the state of an unselected memory cell while writing a selected memory cell. Write disturbs can be attributed primarily to stray magnetic fields interacting with unselected or half-selected memory cells. In addition, stray magnetic field interaction with the selected memory cell may diminish the magnitude of the magnetic field applied to the selected memory cell such that the selected cell cannot be written to a new state. In either case, stray magnetic fields often produce unpredictable behavior in the MRAM.

It can be easily shown that x and y magnetic fields are generated by currents flowing through y-oriented and x-oriented conductors, respectively. By way of example, FIG. 1B illustrates a bit line conductor 106 carrying a current flowing out of the page that produces a magnetic field emanating from the bit line 106 in a counterclockwise rotation, in accordance with the well known right-hand rule. The magnetic field emanating from a conductor decays inversely with the radial distance from the center of the conductor. Therefore, the magnetic field strength at a distance 124 near the center of the current-carrying bit line conductor 106 is greater compared to the magnetic field strength at a distance 126 which is radially further from the center of the bit line.

Stray magnetic fields emanating from the conductors carrying the write current can couple into adjacent rows of unselected memory cells. Even though the stray magnetic fields are smaller in magnitude than the magnetic field applied to a selected cell (either because the unselected cell is further from the current-carrying conductor or because the stray magnetic fields are out-of-plane with respect to the unselected cell) and thus would at first seem to have an insignificant affect on unselected memory cells, a stray magnetic field along one axis may combine with a half-select magnetic field along another orthogonal axis and push an unselected memory cell close to or beyond its switching threshold. This may be especially true for memory cells that are vertically stacked and share a common word line 104, for example, memory cells 112 and 116, or memory cells 114 and 118, since the stray magnetic field generated while writing a selected memory cell 112 will be in-plane with respect to the other memory cell 116.

While writing a selected memory cell 112, the effect of stray magnetic fields on adjacent memory cells 114, 116, 118 can be minimized, in accordance with one aspect of the present invention, by concurrently writing multiple selected memory cells on at least a portion of a given word line 104 and selectively adjusting an easy axis magnetic field, generated by a current flowing through a corresponding bit line 106 associated with the selected memory cell 112, applied to the selected memory cells. The easy axis magnetic field is preferably adjusted by operatively controlling at least a portion of the write current flowing through the particular bit line 106 associated with the selected memory cell 112 based at least in part on the data being written to one or more neighboring selected memory cells. Preferably, the inventive field compensation scheme is based primarily on the data being written into the closest memory cell 116 (e.g., vertically adjacent) for a given stacked pair of memory cells 112, 116, since the most significant stray magnetic fields will be generated by immediately adjacent memory cells.

Magnetic field interaction between vertically adjacent memory cells 112, 116 or 114, 118 has significance not only because the cells are in close proximity to one another, but also because the stray magnetic field produced by a write operation on one of the memory cells 112 is predominantly in-plane with respect to the other memory cell 116, as previously stated. The magnetic field interaction between a memory cell 114 residing in a horizontal plane with respect to a selected cell 112 (i.e., laterally disposed with respect to one another) is less significant at least in part because the stray magnetic field produced while writing the selected memory cell 112 will have predominantly out-of-plane components that interact with the neighboring memory cell 114. It is to be appreciated that in-plane magnetic fields play a far more significant role in switching the state of a magnetic cell than out-of-plane magnetic fields. The magnetic field interaction between horizontally disposed memory cells will be described in more detail herein below.

As understood by those skilled in the art, an MTJ is essentially a sandwich of at least two layers of ferromagnetic (FM) material separated by a thin insulating interlayer. The resistance of the MTJ depends on the relative polarization (parallel or anti-parallel) between the neighboring FM layers. This resistance is a maximum when the directions of the FM layers are anti-parallel and a minimum when the FM layers are parallel. An MTJ structure is designed to have two stable magnetic states in small magnetic fields, corresponding to parallel and anti-parallel orientation of the FM layers in the MTJ device.

In the illustrative stacked memory cell arrangement shown in FIG. 1B, it is difficult to write one memory cell 112 within a vertical pair of adjacent memory cells 112, 116 without also disturbing the other memory cell 116, given that all cells along the word line 104 are half-selected and significant stray magnetic fields 126 (generated as a byproduct of writing memory cell 112) couple into memory cell 116. In accordance with one aspect of the present invention, one way to avoid a write disturb of memory cell 116 is to simultaneously write both memory cells 112, 116 and adjust the magnetic fields used to write both cells so that the magnetic fields emanating from bit lines 106, 120, respectively, optimally combine to create an efficient magnetic field interaction on both memory cells 112, 116 to switch the magnetic moment of the respective cells to their new states, either parallel or anti-parallel.

Magnetic field compensation, in accordance with the present invention, comprises selectively controlling the magnitudes of the currents flowing through two or more bit lines corresponding to selected memory cells based, in one aspect, on the data to be written into the selected memory cells, as stated above. The state to be written into a particular memory cell(s) will be determined by the direction of current flowing in the corresponding bit line. Consequently, the data to be written into a pair of vertically adjacent (i.e., stacked) memory cells will determine whether the two magnetic fields emanating from the respective bit lines will at least partially combine with or cancel each other.

Because the data to be written into the memory cells is known a priori, the current flowing through each bit line can be controlled to most effectively compensate for an anticipated magnetic field interaction. The magnetic field interaction may be considered "anticipated" because the interaction for which magnetic field compensation is being afforded, in accordance with the invention, is based on next state data to be written into selected memory cells that are in close proximity to one another. In this manner, the data-dependent field compensation scheme of the present invention provides an effective means to increase the write margin between selected and unselected memory cells.

With continued reference to FIG. 1B, in order to effectively control the bit line currents for writing a given pair of vertically adjacent memory cells 112, 116, it is first important to understand how the magnetic fields emanating from the respective bit lines 106, 120 interact with each other while writing the memory cells 112, 116 to a particular logic state, assuming no magnetic field compensation is employed. Because each memory cell in the MRAM can assume one of two stable logic states, as determined by the direction of the write current flowing in a corresponding bit line, there are essentially four possible combinations of magnetic field interaction for a given pair of vertically adjacent memory cells 112, 116 sharing a common word line 104. However, there are only two cases of combinations that need be considered for determining how to adjust the magnitudes of the respective write currents, in accordance with the present invention.

In a first case (case A), the pair of memory cells 112, 116 are written to the same magnetic state (i.e., both cells having their magnetic moments oriented either in parallel or anti-parallel states) with respect to each other. As seen in FIG. 1B, in order to write the two memory cells 112, 116 to the same magnetic states, the write currents in corresponding bit lines 106, 120, respectively, must flow in opposite directions relative to one another. With respect to a particular selected memory cell 112, the stray magnetic field contribution from adjacent bit line 120 will at least partially add to the magnetic field generated by the corresponding bit line 106, thereby increasing the overall magnitude of the write field experienced by memory cell 112. The same holds true when considering the effects of the stray magnetic field contribution from adjacent bit line 106 on memory cell 116. Accordingly, when vertically adjacent memory cells 112, 116 sharing a common word line 104 are simultaneously written to the same magnetic state, the magnitude of write current flowing through each bit line 106, 120 required to write a corresponding memory cell 112, 116, respectively, can be reduced by a predetermined amount (e.g., by the magnitude of the stray magnetic field component) compared to the current required to write an individual memory cell with no stray magnetic field interaction present. The requisite magnitude of current for case A can be defined as $I_{LOW}$.

Similarly, in a second case (case B), the pair of memory cells 112, 116 are written to different magnetic states (i.e., one memory cell oriented parallel, the other cell oriented anti-parallel) with respect to each other. In order to write the two memory cells 112, 116 to different magnetic states, the write currents in corresponding bit lines 106, 120, respectively, must flow in the same direction relative to one another. With respect to a given memory cell 112, the stray magnetic field contribution from the adjacent bit line 120 will at least partially diminish (i.e., cancel) the magnetic field generated by the corresponding bit line 106, thereby reducing the overall magnitude of the write field experienced by memory cell 112. Again, the same holds true when considering the effects of the stray magnetic field on memory cell 116. Therefore, when vertically adjacent memory cells 112, 116 sharing a common word line 104 are simultaneously written to different magnetic states, the write current flowing through each corresponding bit line 106, 120 must be increased or supplemented by a predetermined amount (e.g., by the magnitude of the stray magnetic field component) to offset the stray magnetic field interaction. The requisite magnitude of current for case B can be defined as $I_{HIGH}$. A difference between the magnitude of current required for the two cases, namely, $I_{HIGH}-I_{LOW}$, is preferably defined as $I_{DIFF}$.

For the illustrative embodiment shown in FIG. 1B, Table 1 below summarizes the four possible states for the pair of vertically adjacent memory cells 112, 116. As stated above and as evident in Table 1, only two cases need to be considered for adjusting the write currents in the corresponding bit lines 106, 120 to compensate for stray magnetic field interaction. Table 1 further illustrates that, in accordance with one aspect of the invention, an output signal derived from the states to be written into the memory cells 112, 116 can be generated and used for operatively controlling the magnitude of the write currents to optimize the magnetic fields applied to the memory cells. This output signal is preferably an exclusive-OR (XOR) operation on the two bit line current directions and may be used to select whether the current $I_{LOW}$ or $I_{HIGH}$ is to flow through the respective bit lines 106, 120. The desired states to be written into the cells 112, 116 (i.e., next states) determines the current direction within bit lines 106, 120, respectively.

TABLE 1

| State for vertical pair of memory cells 112, 116 | 0,0 | 1,0 | 0,1 | 1,1 |
| --- | --- | --- | --- | --- |
| Current direction within bit line 106 | − | + | − | + |
| Current direction within bit line 120 | + | + | − | − |
| XOR of memory cell states | 0 | 1 | 1 | 0 |
| Magnitude of current within bit line 120 | $I_{LOW}$ | $I_{HIGH}$ | $I_{HIGH}$ | $I_{LOW}$ |
| Magnitude of current within bit line 106 | $I_{LOW}$ | $I_{HIGH}$ | $I_{HIGH}$ | $I_{LOW}$ |

In Table 1 above, a logic "0" state may be arbitrarily defined as a memory cell having an anti-parallel polarization, while a logic "1" state may be defined as a memory cell having a parallel polarization. Similarly, with regard to the bit line currents, a "−" may be used to represent an arbitrary first current direction (e.g., out of the page) while a "+" is used to represent a second current direction which is opposite to the first current direction (e.g., into the page). As shown in Table 1, the data-dependent XOR output signal can be used to selectively control the magnitude of current flowing through the bit lines 106, 120, with a logic "0" being used to generate the current $I_{LOW}$ and a logic "1" being used to generate the current $I_{HIGH}$.

Figure 2A:
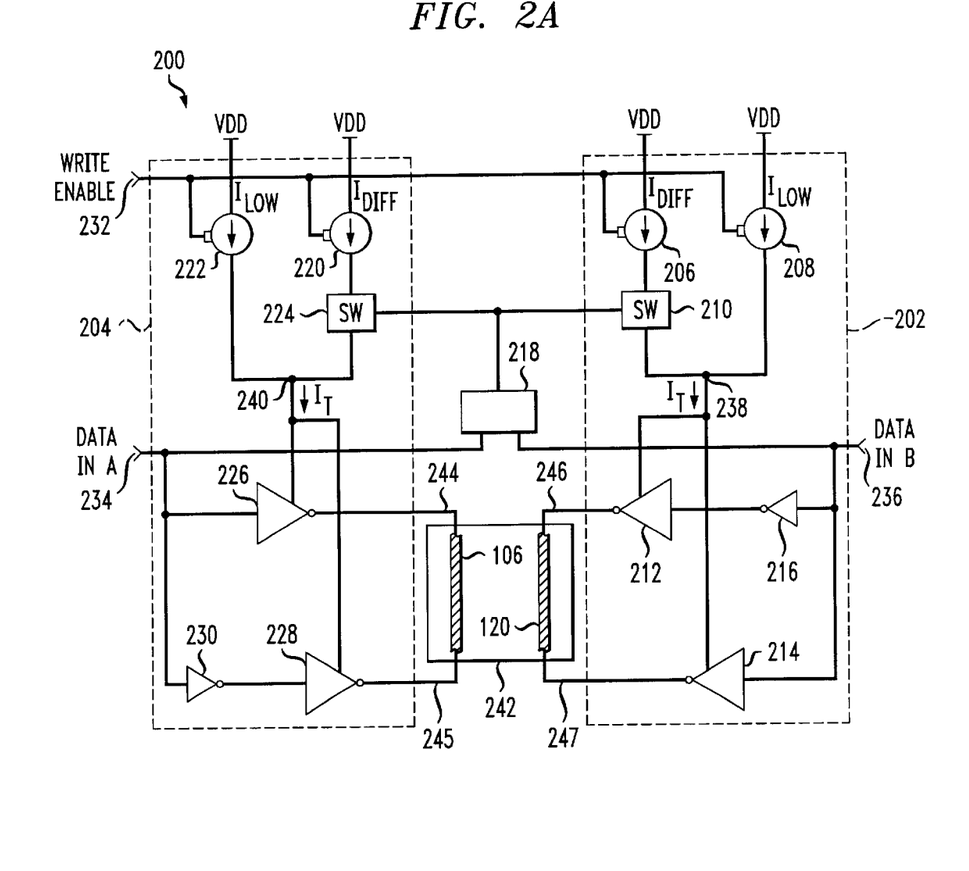
FIG. 2A is a schematic diagram illustrating a field compensation circuit employing data-dependent compensation, in accordance with one aspect of the present invention.

By way of illustration only, FIG. 2A depicts a field compensation circuit 200 for generating write currents, as shown in Table 1 above, for a given pair of vertically adjacent memory cells 242 (e.g., memory cells 112, 116 in FIG. 1B), in accordance with one aspect of the present invention. Field compensation circuit 200 includes two current generators 202 and 204 for supplying write current to bit lines 120 and 106, respectively. Current generator 202 preferably includes a first constant current source 208 which produces a current $I_{LOW}$ and a second constant current source 206 which produces a current $I_{DIFF}$, which is equal to $I_{HIGH}-I_{LOW}$ as defined above. Each of the two current sources 206, 208 may include a control input for selectively activating the current sources in response to an enable signal (e.g., write enable) 232 coupled to the respective control inputs.

Likewise, current generator circuit 204 includes a first constant current source 222 which produces a current $I_{LOW}$ and a second constant current source 220 which produces a current $I_{DIFF}$. Each of the two current sources 220, 222 preferably includes a control input for selectively activating the current sources in response to the enable signal 232 coupled to the respective control inputs. Suitable current sources for use with the present invention are well known by those skilled in the art. Moreover, one or more global current sources (not shown) may be employed in conjunction with local transistor devices to provide a replica current where required.

In order to provide multiple levels of current, namely, $I_{LOW}$ and $I_{HIGH}$, as previously described, current source 206 in current generator 202 is preferably coupled to a corresponding switch 210 that is controlled by a select circuit 218 operatively coupled to an input of the switch 210 for selectively combining current source 206 with current source 208 at a common output node 238. Switch 210 may be implemented, for example, as a standard pass transistor, multiplexer, or suitable alternative thereof, as will be understood by those skilled in the art. The select circuit 218 may be implemented as, for example, an XOR gate having inputs (e.g., DATA IN A and DATA IN B) that are the states to be written into the memory array 242 and, more specifically, the corresponding pair of memory cells 112,116 depicted in FIG. 1B.

Similarly, in current generator 204 of FIG. 2A, current source 220 is preferably coupled to a corresponding switch 224 that is controlled by the select circuit 218 operatively coupled to an input of the switch 224 for selectively combining current source 220 with current source 222 at a common output node 240. Switch 224 may be implemented, for example, as a standard pass transistor, multiplexer, or suitable alternative thereof. In either current generator 202, 204, the current $I_{DIFF}$ generated by current sources 206, 220, respectively, when activated, will be summed with the current $I_{LOW}$ generated by current sources 208, 222, respectively, to produce an output current $I_{HIGH}$ at nodes 238, 240, respectively. When current sources 206, 220 are not activated (i.e., disabled), only the current $I_{LOW}$ will be output from nodes 238, 240, respectively.

With reference to FIGS. 1B and 2A, when the net effect of the stray magnetic fields emanating from bit line 106, for example, is to diminish the write magnetic field emanating from bit line 120, the select circuit 218 will sense the DATA IN A input, representing the state to be written into memory cell 112, and the DATA IN B input, representing the state to be written into memory cell 116, and will boost the bit line magnetic field by enabling switches 210, 224. When enabled, switches 210, 224 allow the $I_{DIFF}$ current sources 206, 220 to be combined with the $I_{LOW}$ current sources 208, 222 to generate the requisite $I_{HIGH}$ currents, thereby compensating for stray magnetic field interaction, as previously described.

With continued reference to FIG. 2A, each of the current generator circuits 202, 204 preferably includes a first current driver 212, 226, respectively, connected to a first end 246, 244 of a corresponding bit line 120, 106, respectively, and a second current driver 214, 228, respectively, connected to a second end 247, 245 of the corresponding bit line. In order to provide bidirectional current control, each of the current drivers is preferably able to be selectively configured as either a current source or a current sink in response to a control signal applied to a data input of the driver. The data input of current driver 226 and current driver 228 are operatively coupled to the DATA IN A input, while the data input of current driver 212 and current driver 214 are operatively coupled to the DATA IN B input.

In a current source mode of operation, a given current driver preferably receives a current $I_T$ at a current input of the driver and directs this current $I_T$ to an output of the driver. Similarly, in a current sink mode of operation, the current driver preferably sinks current received from the output of the driver to a negative voltage supply, such as, for example, ground. In each current generator 204, 202, the current inputs of the two current drivers 226, 228 and 212, 214, respectively, are connected to the output node 240, 238, respectively, of the corresponding current sources.

For a particular bit line, the two current drivers connected to the bit line operate in a complimentary mode with respect to one another (i.e., one current driver configured as a current source, the other current driver configured as current sink). Consequently, the input signal DATA IN A, DATA IN B connected to one of the two current drivers in current generator 204, 202, respectively, is preferably inverted prior to being connected to the data input of the particular driver, such as, for example, by passing the input signal through a standard inverter 230, 216, respectively. This circuit configuration may be referred to herein as a push-pull arrangement. It is to be appreciated that since the bit lines 106, 120 within memory array 242 (corresponding to a given pair of vertically adjacent memory cells 112, 116 of FIG. 1B) are arranged as mirror images of one another, the current drivers 228, 212 receiving the inverted data input will reside at opposite ends 245, 246 of the respective bit lines with regard to one another.

By way of example only, when the data to be written into memory cell 112 is a logic "1" and adjacent memory cell 116 is a logic "0," input signals DATA IN A and DATA IN B will be a logic "1" and a logic "0," respectively. Consequently, select circuit 218, which performs an XOR operation of the memory cell data, will generate a logic "1" at its output in response to signals DATA IN A and DATA IN B, thus enabling switches 210, 224. With switches 210, 224 active, current $I_{HIGH}$ (i.e., $I_{LOW} + I_{DIFF}$) will flow through the output nodes 238, 240. The logic "1" DATA IN A signal will cause current driver 226 to operate in a current sink mode and current driver 228 (which receives a logic "0" from an inverted DATA IN A input) to operate in a source mode, as previously explained. The current $I_{HIGH}$ will then flow from output node 240 through current driver 228, through bit line 106 (from the second end 245 to the first end 244 of the bit line), and returned to ground through current driver 226.

Similarly, The logic "0" DATA IN B signal will cause current driver 212 (which receives a logic "1" from an inverted DATA IN B input) to operate in a sink mode and current driver 214 to operate in a source mode. The current $I_{HIGH}$ will therefore flow from output node 238 through current driver 214, through bit line 120 (from the second end 247 to the first end 246 of the bit line), and returned to ground through current driver 212. Thus, the current flowing through the two bit lines 106, 120 will be in the same direction, as depicted in Table 1.

Figure 2B:
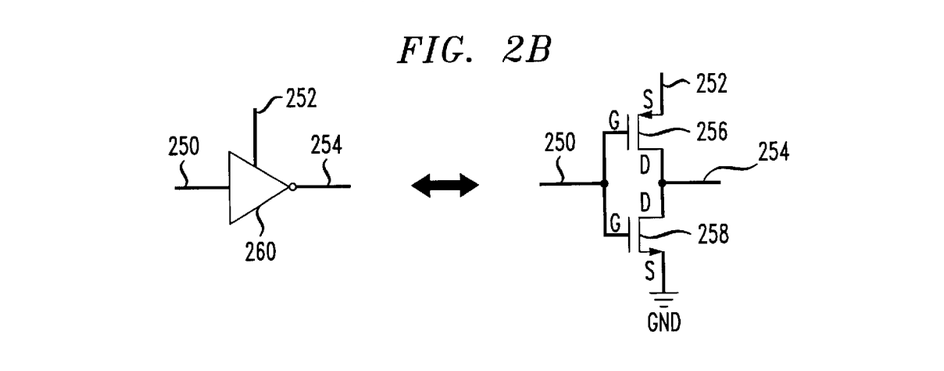
FIG. 2B is a schematic diagram illustrating one embodiment of a bidirectional current driver for use with the write circuit shown in FIG. 2A.

A current driver implementation suitable for use with the present invention is shown in FIG. 2B. With reference now to FIG. 2B, each current driver 260 preferably includes a data input 250, a current input 252 and an output 254, as previously described. The current driver 260 is preferably implemented with a p-type metal-oxide-semiconductor (PMOS) transistor 256 and an n-type metal-oxide-semiconductor (NMOS) transistor 258, each of the transistors having a gate terminal (G), a drain terminal (D) and a source terminal (S), although other suitable alternatives for the current driver are contemplated by the present invention. Specifically, the transistors 256 and 258 are preferably connected in a manner consistent with a conventional inverter, except that the source terminal of the PMOS transistor 256 is connected to the current input 252 rather than being connected to a positive voltage supply, such as VDD. The gate terminals of the two transistors are connected together and form the data input 250 of the driver and the drain terminals of transistors are connected together to form the output 254 of the driver. The source terminal of NMOS transistor 258 is connected to ground, or a suitable negative supply voltage.

When the current driver 260 receives a logic "1" signal at the data input 250, NMOS transistor 258 turns on and the PMOS transistor 256 turns off, thereby configuring the current driver as a current sink to a negative voltage supply, such as ground. Conversely, when the current driver 260 receives a logic "0" signal at the data input 250, the NMOS transistor 258 turns off and the PMOS transistor 256 turns on, thereby configuring the current driver as a current source, wherein the current received at the current input 252 is operatively transferred to the output 254 of the current driver.

When fabricating the MRAM array of the present invention, the field compensation circuit 200 depicted in FIG. 2A is not significantly larger in area compared to conventional write circuits, since essentially only an additional XOR gate, two switches, and an additional current source $I_{DIFF}$ are required. Moreover, since the requisite size of the current source used by a conventional write circuit to supply write current to a particular bit line is generally larger than the two current sources $I_{LOW}$ and $I_{DIFF}$ included in the present invention, the two smaller current sources can be fabricated in substantially the same area as the conventional larger current source.

It is to be appreciated that the data-dependent field compensation techniques of the present invention may be extended to compensate for the magnetic field interaction of multiple pairs of adjacent memory cells. This is especially advantageous in a densely packed MRAM array where the stray magnetic fields of memory cells that are not immediate nearest neighbors is more significant due, at least in part, to the closer proximity of the cells relative to one another. Unlike the example described herein where only a single pair of memory cells was written simultaneously, when n adjacent memory cells are written simultaneously there will be $2^n$ possible combinations of magnetic field interaction, although the number of field compensation cases to consider will be less than the total number of combinations.

The data-dependent field compensation techniques of the present invention described thus far have focused primarily on vertically adjacent pairs of memory cells, since bit lines associated with laterally adjacent memory cells (i.e., in the same horizontal plane) will produce predominantly out-ofplane magnetic fields with respect to one another. However, memory cells that reside laterally adjacent to a selected memory cell will experience an in-plane component of the stray magnetic field from the adjacent bit line, although these magnetic field contributions will be less significant than for vertically adjacent cells.

In a densely packed MRAM array, stray magnetic fields from laterally (i.e., horizontally) adjacent memory cells are more significant due, at least in part, to the closer proximity of the memory cells to one another. Thus, even though the stray magnetic fields generated while writing these laterally adjacent memory cells will be predominantly out-of-plane, at least a portion of the magnetic fields will include in-plane components. Therefore, it is advantageous to extend the data dependent field compensation techniques of the present invention to provide field compensation for the stray magnetic field effects of writing laterally adjacent memory cells as well as vertically adjacent cells, as previously described.

Figure 3:
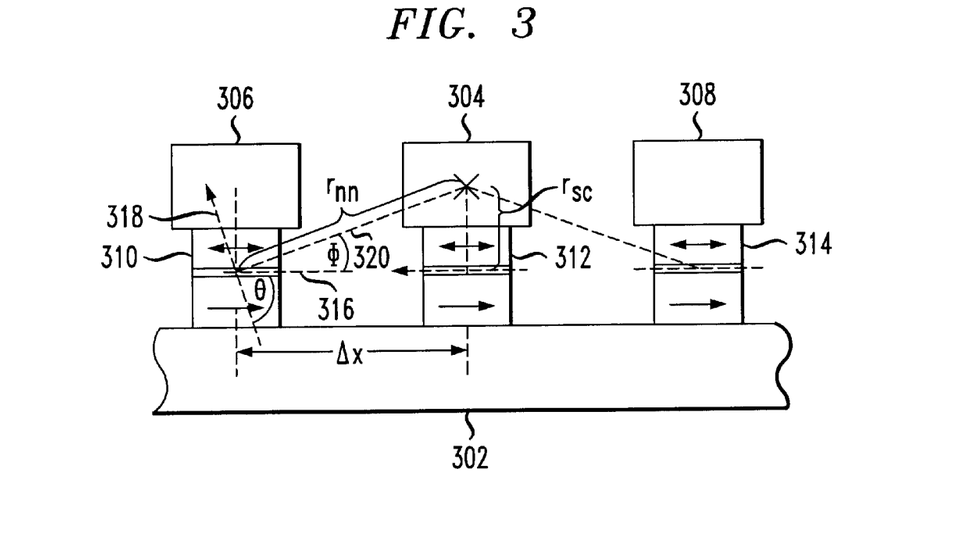
FIG. 3 is a cross-sectional view of at least a portion of an MRAM array illustrating an interaction of stray magnetic fields between laterally adjacent memory cells.

As depicted in FIG. 3, stray magnetic fields emanating from an active bit line 304, which may be defined as a bit line carrying write current, associated with a selected memory cell 312 also couple into nearest neighbor memory cells 310, 314 disposed laterally in relation to the selected memory cell and along the same word line 302. The in-plane component of the stray magnetic field increases the potential of disturbing the state of the aforementioned nearest neighbor cells 310, 314. From FIG. 3, it can be shown that the in-plane stray magnetic field $H_{nn}$ generated by a particular bit line 304 that is coupled to a nearest neighbor memory cell 310 is approximately $$H_{nn} \propto \frac{\cos\theta}{r_{nn}} \qquad [1]$$

where $r_{nn}$ is defined herein as the distance between the active bit line 304 and a laterally adjacent nearest neighbor memory cell 310, the magnitude of which is the radial distance from the center of the bit line 304 to a free magnetic layer of the adjacent memory cell 310 (i.e., the free magnetic moment), and $\theta$ is an angle between a line 316 drawn parallel to a polarization direction of memory cell 310 and a line 318 drawn orthogonal to line 320 representing the distance $r_{nn}$.

Likewise, the in-plane magnetic field generated by bit line 304 which is coupled to corresponding selected memory cell 312 is approximately $$H_{sc} \propto \frac{1}{r_{sc}}, \qquad [2]$$

where $r_{sc}$ is defined herein as the distance between the active bit line 304 and the selected memory cell 312, the magnitude of which is the vertical distance from the center of bit line 304 to the free magnetic layer of memory cell 312. Using a well known trigonometric identity, equation [1] above can be rewritten as $$H_{nn} \propto \frac{\sin\phi}{r_{nn}} = \frac{r_{sc}}{r_{nn}^2} = \frac{r_{sc}}{r_{sc}^2 + \Delta x^2}, \qquad [3]$$

where $\phi$ is defined herein as the angle between line 316 and line 320, and $\Delta x$ is the horizontal distance between nearest neighbor memory cells 310 and 312, as measured from the center of each cell. From equations [2] and [3] above, the fractional in-plane stray magnetic field component $H_{nn}/H_{sc}$ coupled to nearest neighbor memory cell 310 can be determined as $$\frac{H_{nn}}{H_{sc}} = \frac{1}{1 + \left(\frac{\Delta x}{r_{sc}}\right)^2}. \qquad [4]$$

Typically, the in-plane stray magnetic field coupled into a nearest neighbor memory cell from an active bit line is about ⅛ to about 1/20 the magnitude of the in-plane write field coupled into the selected memory cell associated with the active bit line. Although these stray magnetic fields are considerably smaller than the write field associated with a selected memory cell, write margins are so narrow between selected and half-selected memory cells that one or more fractional fields of the aforementioned size superimposed on a half-selected memory cell (e.g., along the same word line) may undesirably affect the state of the cell. As seen from equation [4] above, as the distance $\Delta x$ between neighboring memory cells gets smaller (e.g., as in a densely packed MRAM array), the magnitude of the in-plane magnetic field component coupled into a half-selected memory cell increases.

As previously stated, the magnitude of the magnetic field emanating from a given conductor is directly proportional to the magnitude of the current flowing in the conductor. Therefore, once the relationship between the magnitude of the stray magnetic field $H_{nn}$ and the magnitude of the write field $H_{sc}$ is determined (as illustrated above), the write current flowing through a given bit line can be adjusted by a predetermined amount to compensate for nearest neighbor stray magnetic field interaction among adjacent bit lines, in accordance with another aspect of the present invention. Since $H_{sc}$ represents the base magnetic field and $H_{nn}$ relates to the magnetic field adjustment, equation [4] can also be used to determine a ratio of the write current compensation adjustment $I_{adj}$ to the base write current $I_{base}$ flowing in a bit line. Solving for the write current adjustment yields $$I_{adj} = \frac{I_{base}}{1 + \left(\frac{\Delta x}{r_{sc}}\right)^2}. \qquad [5]$$

Figure 4A:
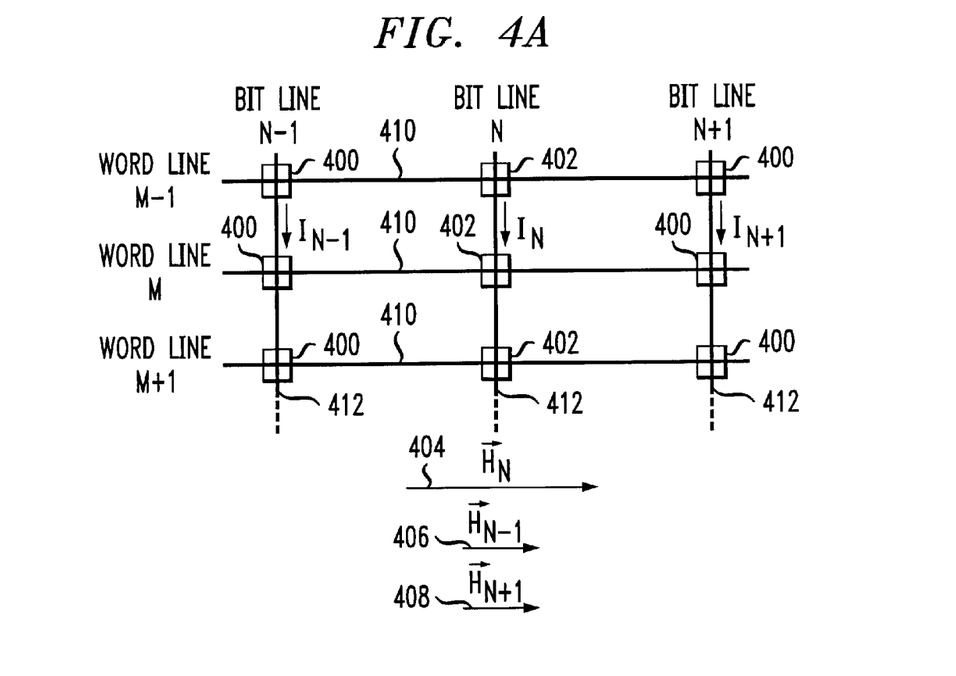
FIGS. 4A–4C depict at least a portion of an MRAM array having magnetic memory cells disposed at intersecting regions of orthogonal word and bit lines illustrating three magnetic field interaction scenarios between a selected bit line and adjacent bit lines corresponding to nearest neighbor memory cells.
Figure 4B:
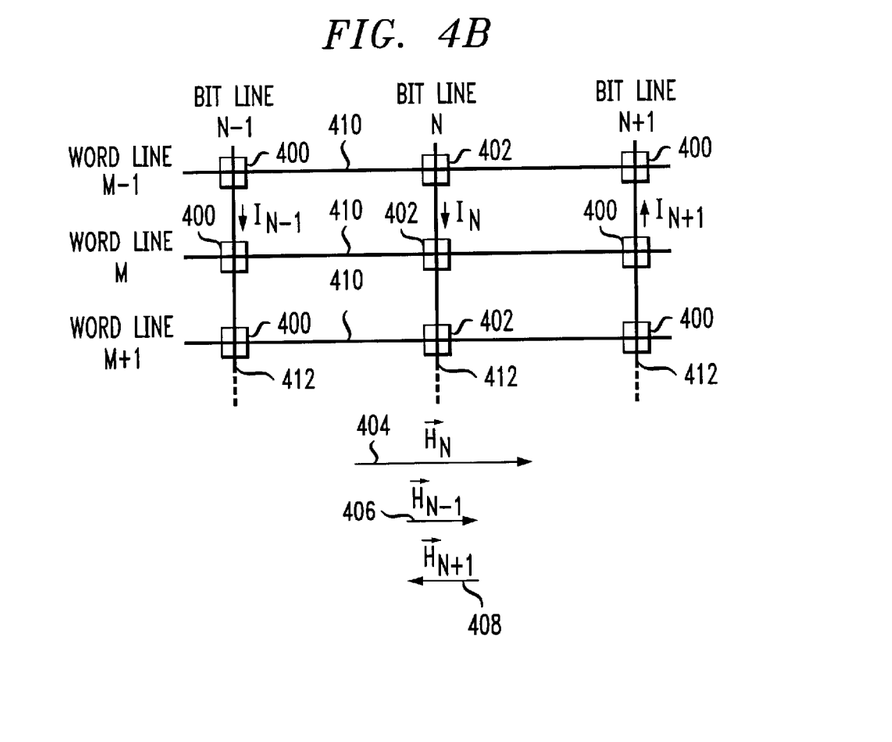
Figure 4C:
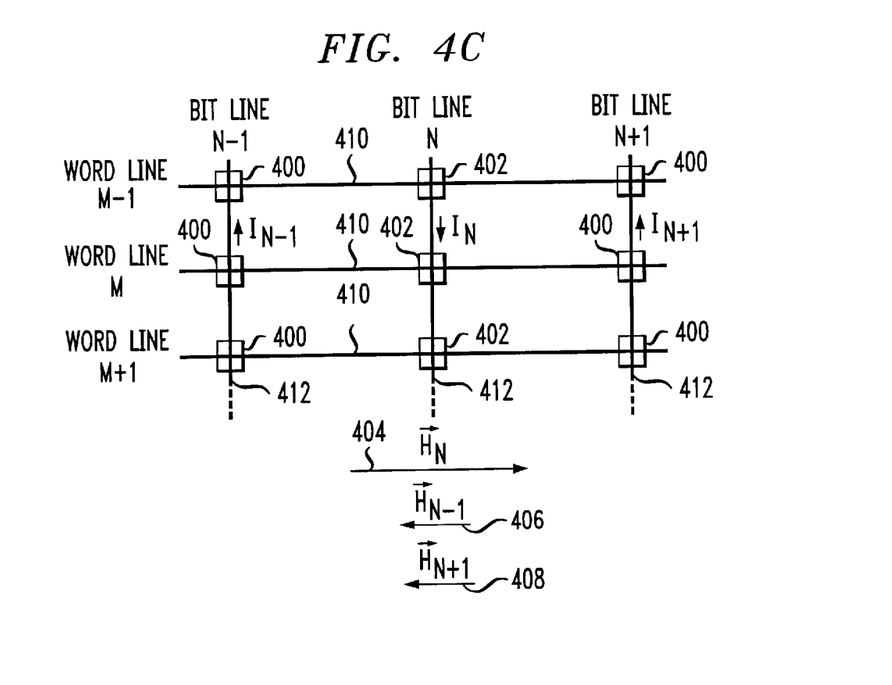

With reference now to FIGS. 4A through 4C, three different stray magnetic field interaction scenarios are illustrated. In these figures, a plurality of memory cells 400, 402 are shown disposed between intersecting orthogonal word lines 410 and bit lines 412. A particular memory cell is selected by the coincidence of a magnetic field originating from a word line and a field originating from a bit line, as described herein above. A subset of memory cells along a selected word line (e.g., word line M−1, M, M+1) is written simultaneously, the subset corresponding to those memory cells having bit line fields acting upon them. Since the superposition of write fields is tractable based on the states written into the cells that occupy adjacent bit lines, currents within the bit lines can be adjusted to optimize the write field applied to selected cells and half-selected cells so that the write margin between selected cells and unselected cells can be maximized.

FIG. 4A illustrates the superposition of in-plane magnetic fields on memory cells 402 along the same bit line N in which write currents $I_{N-1}$ and $IN_{+1}$ flowing through adjacent bit lines N−1 and N+1, respectively, are oriented in the same direction as the write current $I_N$ flowing through bit line N. In this first case (case 1), the resultant stray magnetic field $\vec{H}_{N-1}$ 406, emanating from adjacent bit line N−1, and stray magnetic field $\vec{H}_{N+1}$ 408, emanating from adjacent bit line N+1, will add together with the write magnetic field $\vec{H}_N$ 404 emanating from the selected bit line N to create a composite magnetic field within a region proximate to bit line N having a magnitude greater than the intended write field $\vec{H}_N$ 404 alone. Consequently, the write current flowing through bit line N can be reduced by a predetermined amount, preferably by the magnitude of the stray in-plane magnetic field components.

Similarly, FIG. 4B depicts a second case (case 2) illustrating the superposition of in-plane magnetic fields on memory cells 402 along bit line N in which the write currents $I_{N-1}$ and $I_{N+1}$ flowing through adjacent bit lines N−1 and N+1, respectively, are oriented in opposite directions with respect to one another. In case 2, the resultant in-plane stray magnetic fields $\vec{H}_{N-1}$ 406 and $\vec{H}_{N+1}$ 408, emanating from nearest neighbor bit lines N−1 and N+1, respectively, will cancel each other within the region of the selected bit line N such that the resulting composite magnetic field will essentially have the same magnitude and direction as the intended write field $\vec{H}_N$, 404 alone. Consequently, no write field compensation is required for case 2.

FIG. 4C depicts a third case (case 3) illustrating the superposition of in-plane magnetic fields on memory cells 402 along bit line N wherein write currents $I_{N-1}$ and $I_{N+1}$ flowing through adjacent bit lines N−1 and N+1, respectively, are oriented in the same direction with respect to one another and in an opposite direction of write current $I_N$ flowing through bit line N. In case 3, the resultant in-plane stray magnetic fields $\vec{H}_{N-1}$ 406 and $\vec{H}_{N+1}$ 408, emanating from nearest neighbor bit lines $N_{-1}$ and N+1, respectively, sum together and at least partially diminish the write field $\vec{H}_N$ originating from bit line N. Thus, a composite magnetic field within a region proximate to bit line N results having a magnitude which is less than the intended write field $\vec{H}_N$ 404 alone. Accordingly, the write current flowing through bit line N is increased by a predetermined amount, preferably by the magnitude of the stray in-plane magnetic field components, to compensate for the stray magnetic field interaction.

Figure 5:
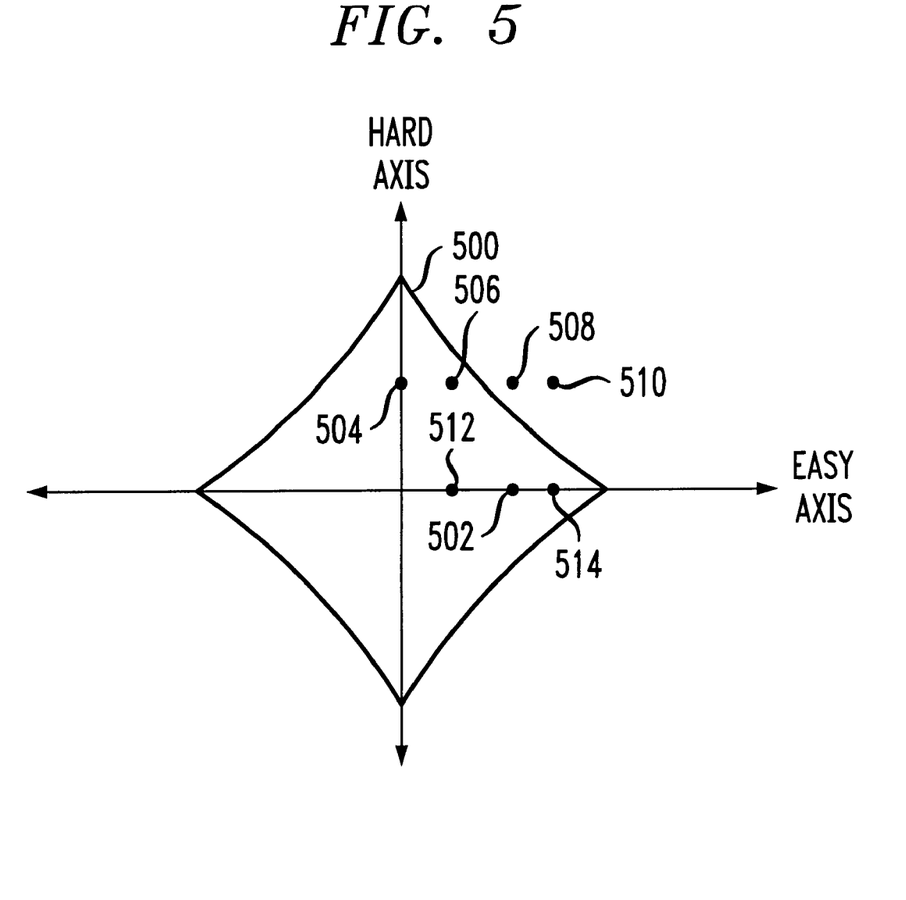
FIG. 5 is a graphical representation of the switching characteristic of a magnetic memory element illustrating the effect of stray magnetic fields on a selected memory cell, the stray magnetic fields emanating from bit lines that are adjacent to the selected memory cell.

FIG. 5 graphically depicts the magnetic selectivity of an ideal thin film magnetic memory cell along a hard magnetic axis (e.g., representing the word line field) and an easy magnetic axis (e.g., representing the bit line field), as described, for example, by E. C. Stoner and E. P. Wohlfarth in a paper entitled "A Mechanism of Magnetic Hysteresis in Heterogeneous Alloys," *Royal Society of London Philosophical Transactions*, Ser. A240 (1948), which is incorporated herein by reference. Assuming that the word line and bit line currents generate fields along the hard magnetic axis and the easy magnetic axis, respectively, of the magnetic memory cell, the field ($H_x$, $H_y$,) required to switch the magnetic state of the cell must equal or exceed the solid curve or boundary 500. This curve 500, known by those skilled in the art as a switching astroid, satisfies the relation $H_x^{2/3}+H_y^{2/3}=H_k^{2/3}$, where $H_x$ is the hard axis field, $H_y$ is the easy axis field and $H_k$ is an anisotropy field.

With reference to FIG. 5, an ideal switching astroid 500 of a selected magnetic memory cell with magnetic field points superimposed is shown, illustrating the effect of stray magnetic field interaction from nearest neighbor bit lines on the switching margin of the selected cell for the three cases shown in FIGS. 4A through 4C. For the sake of simplicity and clarity, the effect of half-select field points generated by the word lines are not included. As understood by those skilled in the art, field points residing outside the boundary of the switching astroid 500 (e.g., field points 508 and 510) are considered large enough to set the polarization of the selected memory cell. Likewise, field points residing within the boundary the switching astroid 500 (e.g., field points 502, 504, 506, 512 and 514) are considered to be too small to set the polarization of the cell.

Field points 504 and 502 correspond to half-selected memory cells in the word dimension and the bit dimension, respectively, and are generated by write currents flowing along either the word line or the bit line of the memory cell. Field point 508 corresponds to a selected memory cell and is generated by the simultaneous application of write currents flowing along both the bit line and the word line of the cell. Other field points, such as, for example, field points 506, 510, 512, and 514, represent the interaction of stray magnetic fields from nearest neighbor bit lines with the magnetic field emanating from the selected bit line.

Recall that in case 1 (depicted in FIG. 4A), the nearest neighbor magnetic fields increase the magnitude of the write field applied to the selected memory cell and the half-selected memory cell. Thus, half-selected field point 514 and corresponding selected field point 510 have larger easy axis field components compared to the selected and half-selected field points 508 and 502, respectively. Half-selected field point 514 is pushed closer to the boundary of the switching astroid 500 as a result of nearest neighbor magnetic field interaction, and hence has less write margin than the half-selected field point 502 without stray magnetic field interaction. Similarly, recall that in case 3 (depicted in FIG. 4C), nearest neighbor magnetic field interaction decreases the magnitude of the write field applied to the selected cell and the half-selected cell. Thus, field points half-selected field point 506 and corresponding selected field point 512 have smaller easy axis field components than the selected and half-selected field points 508 and 502, respectively.

In practice, field point 506, which would otherwise constitute a selected field point in the absence of stray magnetic field interaction, is not selected because the magnetic fields emanating from nearest neighbor adjacent bit lines in case 3 diminish the easy axis magnetic field component in such a manner that field point 506 remains inside the boundary of the switching astroid 500. In this case, the net effect of the stray magnetic field interaction of adjacent bit lines is to undesirably prevent a selected memory cell from being written to a new state. To prevent this from occurring, the write current in the selected bit line, and therefore the magnetic field emanating from the bit line, is preferably adjusted, in accordance with the present invention, to compensate for this magnetic field interaction and return field point 512 to the position represented by field point 502. Likewise, the write current in the selected bit line is preferably adjusted to return field point 514 to the position represented by field point 502. In this way, the write margin between half-selected and selected memory cells is maximized.

Figure 6A:
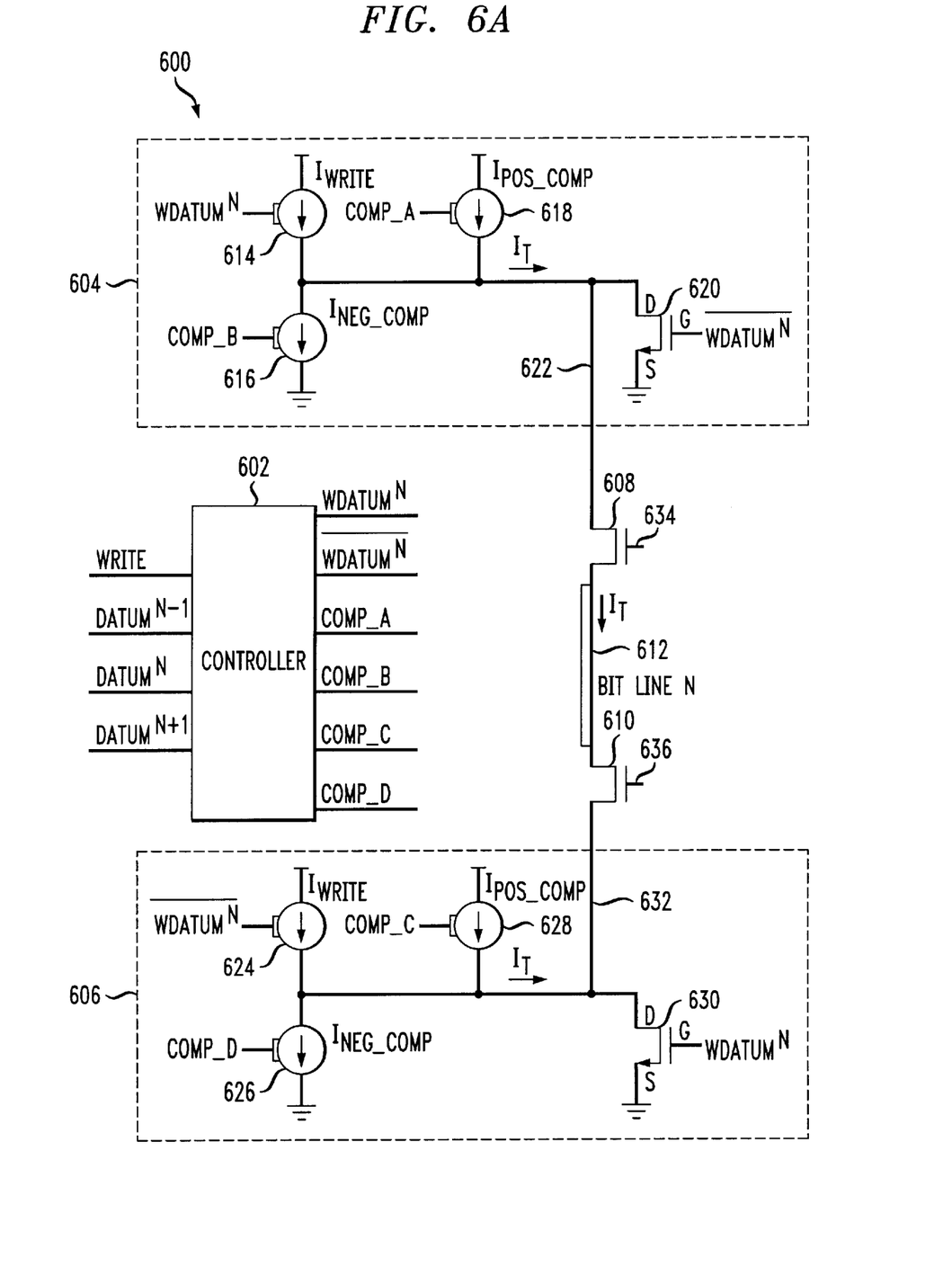
FIG. 6A is a schematic diagram illustrating a field compensation circuit employing data-dependent compensation for nearest neighbor memory cells, in accordance with another aspect of the present invention.

By way of illustration only, FIG. 6A depicts at least a portion of a field compensation circuit 600 for implementing the data-dependent magnetic field compensation methodologies of the present invention. Field compensation circuit 600 operates in a manner consistent with the field compensation circuit 200 described above in connection with FIG. 2A. The illustrative field compensation circuit 600 includes a pair of substantially matched programmable current generators 604, 606 for supplying an adjustable write current to a given bit line (e.g., bit line N 612), preferably through a pair of switches 608, 610 connected between an output 622, 632 of the programmable current generator 604, 606, respectively, and an end of the bit line 612. Each of the switches 608, 610, which may be implemented, for example, as a FET device, includes an input 634, 636, respectively, for receiving a control signal and selecting one of several bit lines through which a compensated write current $I_T$ will pass in response thereto.

The field compensation circuit 600 further includes a controller 602 operatively connected to the programmable current generators for controlling the magnitude of the write current in response to one or more predetermined characteristics representative of an anticipated interaction between a magnetic field emanating from the bit line associated with a selected memory cell and at least one stray magnetic field emanating from one or more bit lines associated with one or more memory cells in proximity to the selected memory cell. As previously stated, the magnetic field interaction is considered anticipated because it is based on next state (i.e., future) data associated with the selected memory cells. Preferably, the predetermined characteristic is the state to be written into the selected memory cell and one or more adjacent memory cells, as previously explained, although other alternative characteristics are contemplated by the present invention. Details of an exemplary controller suitable for use with the present invention will be presented below in conjunction with FIG. 6B.

Each programmable current generator 604, 606 includes a first current source 614, 624, respectively, for providing a nominal write current $I_{WRITE}$. The magnitude of $I_{WRITE}$ is preferably the current required to write a selected memory cell in the absence of stray magnetic field interactions, or when the net effect of stray magnetic field interactions is to cancel each other, as previously described in conjunction with FIG. 4B (case 2). The programmable current generators 604, 606 further include at least a second current source 616, 626, respectively, for providing a negative compensation current $I_{NEG\_COMP}$, and a third current source 618, 628, respectively, for providing a positive compensation current $I_{pos\_COMP}$.

Each of the current sources 614, 616, 618, 624, 626, 628 includes a control input for selectively activating the current source in response to a control signal preferably generated by the controller 602. The current sources in a given programmable current generator 604, 606 are operatively connected together at a summing node 622, 632, respectively, which is the output of the programmable current generator. By selectively activating one or more current sources (e.g., by applying the appropriate control signals to the control inputs of the current sources) in a particular programmable current generator, the compensated write current $I_T$ can be adjusted to account for stray magnetic field interactions, as previously described.

Negative compensation current sources 616, 626 are connected to a corresponding output 622, 632 such that they subtract from the nominal write current sources 614, 624, respectively. For example, if both the nominal write current source and the negative compensation current source are activated concurrently, the compensated write current $I_T$ will be $I_T=I_{WRITE}-I_{NEG\_COMP}$. The negative compensation current sources may be used to adjust the write current $I_T$ to account for the case wherein the net effect of the stray magnetic field interaction is to add to the magnetic field corresponding to a selected memory cell. This case (case 1) was previously described in connection with FIG. 4A.

Similarly, positive compensation current sources 618, 628 are connected to a corresponding output 622, 632 such that they add to the nominal write current sources 614, 624, respectively. For example, if both the nominal write current source and the positive compensation current source are activated concurrently, the compensated write current $I_T$ will be $I_T=I_{WRITE+IPOS\_COMP}$. The positive compensation current sources may therefore be used to adjust the write current $I_T$ to account for the case in which the stray magnetic field interaction diminishes the write field corresponding to a selected memory cell. This case (case 3) was previously described in connection with FIG. 4C. When the stray magnetic fields substantially cancel one another, and thus there is no need for field compensation, only the nominal write current source in a given programmable current generator will be activated (i.e., all compensation current sources will be disabled). This case (case 2) was described above in connection with FIG. 4B.

It is to be appreciated that various other alternative programmable current generator arrangements are contemplated by the present invention. Additionally, the programmable current generators and corresponding controller may be extended and/or modified to supply any number of different current levels, as understood by those skilled in the art. As the number of stray magnetic field interactions which must be considered and compensated for increases, the number of different write current levels and the complexity of the controller increase accordingly.

In order to provide bidirectional write current capability, each of the programmable current generators 604, 606 is able to be selectively configured, in conjunction with a pair of switches 620, 630, respectively, to operated as either a current source (e.g., in a source or push mode) or a current sink (e.g., in a sink or pull mode). As previously stated, the direction of current flowing through a given bit line determines the state to be written into a selected memory cell. Each of the switches 620, 630 is preferably implemented as a FET transistor device having a drain terminal (D), a gate terminal (G) and a source terminal (S). The drain terminal of each switch 620, 630 is connected to an output node 622, 632, respectively, of the corresponding programmable current generator 604, 606, the gate terminal is connected to a control signal $\overline{WDATUM^N}$, $WDATUM^N$, respectively, generated by controller 602 and the source terminal of each switch is connected to a negative voltage supply, which may be ground.

Preferably, the two programmable current generators 604, 606 operate in complimentary modes (i.e., one current generator configured as a current source, the other configured as a current sink) at any given time. Thus, only one set of current sources associated with a particular programmable current generator will be concurrently enabled. For example, if programmable current generator 604 is to be configured as a current source, switch 620 is disabled (e.g., by a logic "0" $\overline{WDATUM^N}$ signal), thus allowing write current $I_T$ to flow out of output node 622, and switch 630 is enabled (e.g., by a logic "1" $WDATUM^N$ signal), thus essentially connecting the output node 632 of current generator 606 to ground.

Field compensation circuit 600 operates in a manner consistent with the circuit shown in FIG. 2A in that the write current flowing through a selected bit line is adjusted in response to the state to be written into one or more adjacent memory cells. However, while the field compensation circuit of FIG. 2A primarily focused on compensating for stray magnetic fields associated with a pair of vertically adjacent memory cells, field compensation circuit 600 takes into account the stray magnetic fields generated by other adjacent bit lines, including those bit lines corresponding to memory cells that are disposed laterally adjacent to the selected memory cell. Consequently, the controller 602 employed by field compensation circuit 600 is modified in comparison to the select circuit 218 of FIG. 2A to detect at least the state to be written into these other adjacent memory cells.

Specifically, controller 602 may receive as input a WRITE signal which, when active, enables the field compensation circuit 600 to generate the write current. The controller 602 also preferably receives as inputs signal DATUM$^N$ associated with the selected bit line N 612 as well as signals DATUM$^{N-1}$, DATUM$^{N+1}$ associated with adjacent bit lines N-1 and N+1 (not shown), respectively. Such signals preferably indicate, for example, the state to be written into the selected memory cell and memory cells adjacent to the selected cell. As previously discussed, the state to be written into a given memory cell will be determined by the direction of the write current flowing through the corresponding bit line, and is therefore indicative of the direction of the magnetic field emanating from the bit line.

Controller 602 preferably generates as outputs control signals WDATUM$^N$, $\overline{\text{WDATUM}^N}$, COMP_A, COMP_B, COMP_C, and COMP_D, representing the various combinations of magnetic field interactions between adjacent bit lines N-1, N and N+1. These output signals are connected to the control inputs of current sources 614, 624, 618, 616, 628 and 626, respectively, in the programmable current generators and are used to selectively enable one or more of the current sources to produce the compensated write current $I_T$, in accordance with the inventive field compensation methodologies described herein.

Figure 6B:
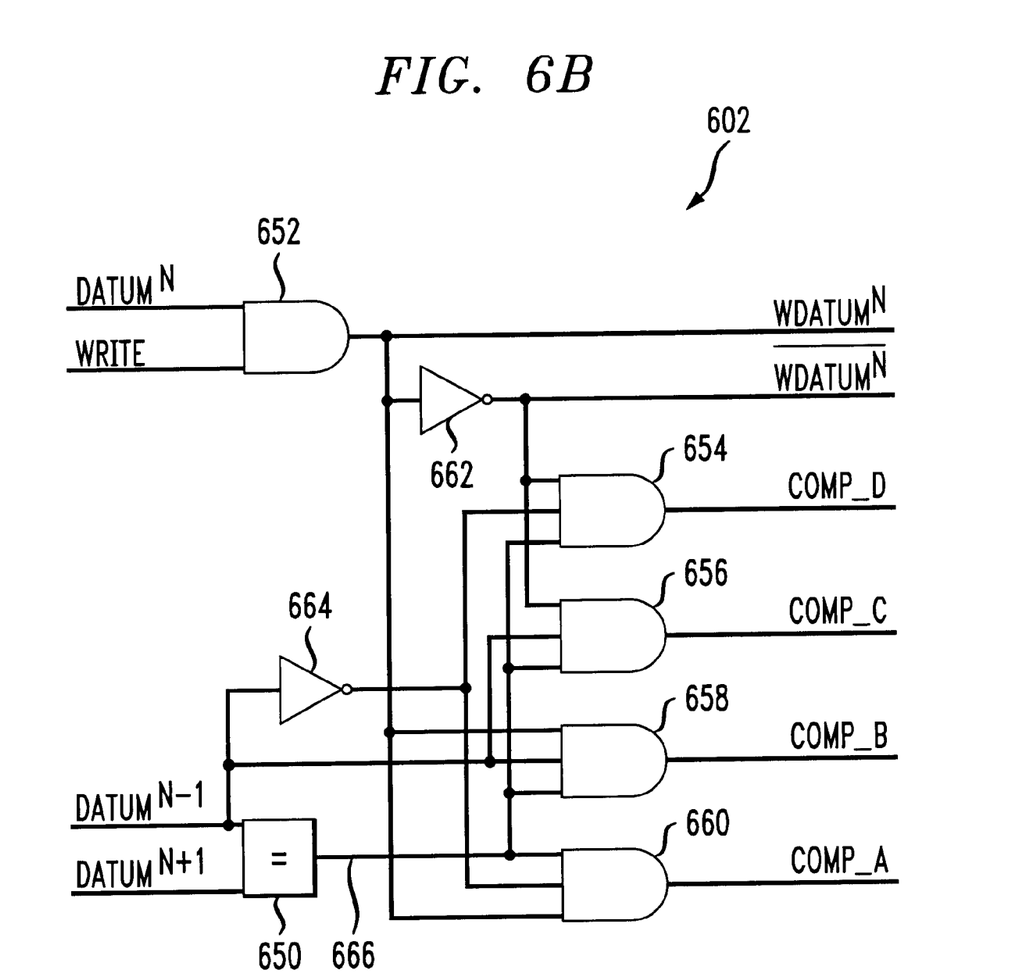
FIG. 6B is a schematic diagram illustrating one embodiment of a controller for use with the field compensation circuit shown in FIG. 6A.

With reference now to FIG. 6B, an exemplary controller 602 suitable for use with the field compensation circuit 600 depicted in FIG. 6A is shown. With reference to FIGS. 6A and 6B, by way of example only, output WDATUM$^N$ is a logical AND 652 of inputs WRITE and DATUM$^N$. Output WDATUM$^N$ is passed through an inverter 662 to generate the compliment output $\overline{\text{WDATUM}^N}$. Output WDATUM$^N$ is used to selectively enable nominal current sources 614, 624, although not simultaneously, and is also used to configure the programmable current generators 604, 606 as either a current source or a current sink. For example, in the illustrative field compensation circuit 600, when WDATUM$^N$ is a logic "1," switch 620 is disabled and nominal current source 614 is enabled, thereby configuring programmable current generator 604 as a current source. Likewise, switch 630 is enabled and nominal current source 624 is disabled, thereby configuring programmable current generator 606 as a current sink.

Output signals COMP_A, COMP_B, COMP_C, COMP_D are used to selectively activate the compensation current sources 618, 616, 628, 626, respectively, when field compensation is required (e.g., case 1 or case 3). Each of the output signals COMP_A, COMP_B, COMP_C, COMP_D is generated by a corresponding three-input AND circuit 660, 658, 656, 654, respectively. Since these sources are only employed when memory cells (e.g., corresponding to bit lines N-1, N+1) adjacent to a selected memory cell (e.g., corresponding to bit line N) are to be written to the same state with respect to one another, an exclusive NOR (XNOR) output 666, generated, for example, by an XNOR circuit 650 including inputs DATUM$^{N-1}$ and DATUM$^{N+1}$, is coupled to an input of each AND circuit 654, 656, 658, 660. Thus, whenever XNOR output 666 is a logic "0," indicating that inputs DATUM$^{N-1}$ and DATUM$^{N+1}$ are different with respect to each other, all compensation signals COMP_A, COMP_B, COMP_C, COMP_D will be a logic "0," thereby disabling the compensation current sources in the programmable current generators.

It is to be appreciated that assuming field compensation is required (i.e., when inputs DATUM$^{N-1}$ and DATUM$^{N+1}$ are the same), only negative or positive compensation is employed at any given time. Therefore, current sources 616, 626 are not enabled when current sources 618, 628 are enabled, and vice versa. Furthermore, since the programmable current generators operate in complimentary modes with respect to each other (i.e., one programmable current generator configured as a current source, the other configured as a current sink), only one set of current sources 616, 618 or 626, 628 will be concurrently enabled. AND circuits 660, 658, which generate output signals COMP_A, COMP_B, respectively, each receive signal WDATUM$^N$ as an input, since these current sources may only be enabled while programmable current generator 604 is operating as a current source (i.e., when signal WDATUM$^N$ is a logic "1"). Similarly, AND circuits 656, 658, which generate output signals COMP_C, COMP_D, respectively, each receive signal $\overline{\text{WDATUM}^N}$ as an input, since these current sources may only be enabled while programmable current generator 604 is operating as a current source (i.e., when $\overline{\text{WDATUM}^N}$ is a logic "1").

Output signal COMP_A is coupled to the control input of positive compensation current source 618, which is preferably enabled by a logic "1." Since current source 618 is only utilized when the selected memory cell and its adjacent memory cells are to be written to opposite states with respect to one another, input signal DATUM$^{N-1}$ is inverted by inverter 654 to generate signal $\overline{\text{DATUM}^{N-1}}$ which is coupled to an input of AND circuit 660. Additionally, since current source 618 may only be enabled when nominal current source 614 is enabled, signal WDATUM$^N$ is also coupled to an input of AND circuit 660.

Output signal COMP_B is coupled to the control input of negative compensation current source 616, which may be enabled by a logic "1." Current source 616 is preferably only utilized when the selected memory cell and its adjacent memory cells are to be written to the same state with respect to one another. Therefore, input signal DATUM$^{N-1}$ (or, alternatively, input signal DATUM$^{N+1}$) is coupled to an input of AND circuit 658. Additionally, since current source 616 will only be enabled when nominal current source 614 is enabled, signal WDATUM$^N$ is also coupled to an input of AND circuit 658.

With regard to programmable current generator 606, output signal COMP_C is coupled to the control input of positive compensation current source 628, which is enabled by a logic "1." Since current source 628 may only be enabled when nominal current source 624 is enabled, signal $\overline{\text{WDATUM}^N}$ is coupled to an input of AND circuit 656. Additionally, since current source 628 is only utilized when the selected memory cell and its adjacent memory cells are to be written to opposite states with respect to one another, signal DATUM$^{N-1}$ (or, alternatively, signal DATUM$^{N+1}$) is also coupled to an input of AND circuit 656.

Output signal COMP_D is coupled to the control input of negative compensation current source 626, which is enabled by a logic "1." Current source 626 is preferably. only used when the selected memory cell and its adjacent memory cells are to be written to the same state with respect to one another. Therefore, input signal $\overline{\text{DATUM}^{N-1}}$ is coupled to an input of AND circuit 654. Furthermore, since current source 626 is only enabled when nominal current source 624 is enabled, signal $\overline{\text{WDATUM}^N}$ is also coupled to an input of AND circuit 658.

To illustrate the operation of field compensation circuit 600, by way of example only, consider that input signal WRITE is a logic "1." Furthermore, consider that the input DATUM$^N$, corresponding to the state to be written into selected memory cell N, is a logic "1" and that inputs DATUM$^{N-1}$ and DATUM$^{N+1}$, corresponding to the states to be written into adjacent memory cells N−1, N+1, respectively, are both a logic "0." Consequently, using the illustrative controller 602, output signal WDATUM$^N$ will be a logic "1," output signal COMP__A will be a logic "1" and output signals COMP__B, COMP__C and COMP__D will all be a logic "0." In this scenario, only nominal current source 614 and positive compensation current source 618 will be enabled, resulting in a compensated write current $I_T$ equal to $I_{WRITE+Ipos\_COMP}$. The compensated write current is greater compared to the nominal write current alone to account for stray magnetic field interactions which, in the example above, diminishes the write field applied to the selected memory cell.

It is to be appreciated that the field compensation techniques of the present invention may be extended to adjust for essentially any number of magnetic field interactions. For example, the programmable current source in the field compensation circuit may be configured to provide any number of quantized current levels, depending on the number of field compensation cases required. Likewise, the controller which is operatively coupled to the programmable current source, may be expanded to generate the required additional control signals for selectively controlling the programmable current source.

Although techniques have been described herein for adjusting the magnetic field emanating from a bit line corresponding to a selected memory cell in response to anticipated magnetic fields emanating from one or more bit lines in close relative proximity to a given selected bit line, the present invention, in accordance with another aspect, may be configured such that the field generated by a particular bit line may be selectively adjusted to compensate for environmental or other characteristics, such as, but not limited to, temperature and processing variations, external electromagnetic interference, etc., all of which may adversely impact the write select margin of a magnetic memory cell. To accomplish this, modifications may be made to the field compensation circuit thus described, such as, for example, by including a detector circuit (e.g., comprising a thermocouple, hall effect device, etc.) adapted to sense a particular condition or characteristic, as required for a particular application.

Although illustrative embodiments of the present invention have been described herein with reference to the accompanying drawings, it is to be understood that the invention is not limited to those precise embodiments, and that various other changes and modifications may be made therein by one skilled in the art without departing from the scope or spirit of the present invention.

What is claimed is:

1. A write circuit for selectively writing one or more magnetic memory cells in a magnetic random access memory (MRAM), comprising:

a programmable current source operatively coupled to a bit line associated with a selected memory cell in the MRAM, the programmable current source including an input for receiving a control signal, the programmable current source generating a write current having a magnitude which varies in response to the control signal; and a controller operatively coupled to the programmable current source, the controller detecting a characteristic representative of an anticipated magnetic field interaction between a magnetic field emanating from the bit line associated with the selected memory cell and at least one stray magnetic field emanating from one or more bit lines associated with one or more memory cells in close relative proximity to the selected memory cell, the controller generating the control signal, the control signal being indicative of the detected characteristic.

2. The circuit of claim 1, wherein the magnetic field interaction is at least partially determined by a state to be written into the selected memory cell and states to be written into the one or more memory cells in close relative proximity to the selected memory cell.

3. The circuit of claim 1, wherein the detected characteristic is derived from states to be written into the selected memory cell and the one or more memory cells in close relative proximity to the selected memory cell.

4. The circuit of claim 1, wherein the magnitude of the write current generated by the programmable current source is one of at least:

(i) a first value when the selected memory cell and a memory cell adjacent to the selected memory cell are to be written to a same state with respect to one another, the first value being less than a nominal write current value; and (ii) a second value when the selected memory cell and the memory cell adjacent to the selected memory cell are to be written to different states with respect to one another, the second value being greater than the nominal write current value.

5. The circuit of claim 1, wherein the magnitude of the write current generated by the programmable current source is one of at least:

(i) a first value when the selected memory cell and two or more memory cells in close relative proximity to the selected memory cell are to be written to a same state with respect to one another, the first value being less than a nominal write current value;

(ii) a second value when the selected memory cell and the memory cells in close relative proximity to the selected memory cell are to be written to different states with respect to one another, the second value being greater than the nominal write current value; and (iii) a third value when anticipated magnetic fields emanating from two or more bit lines associated with the corresponding memory cells in close relative proximity to the selected memory cell substantially cancel one another, the third value being substantially equal to the nominal write current value.

6. The circuit of claim 1, wherein the write current generated by the programmable current source is a nominal value when anticipated magnetic fields emanating from two or more bit lines associated with corresponding memory cells in close relative proximity to the selected memory cell substantially cancel one another, whereby the anticipated magnetic field interaction is substantially zero.

7. The circuit of claim 1, wherein the programmable current source comprises:

a plurality of constant current sources, each of the constant current sources including an output and generating a predetermined current at the output; and at least one switch operatively coupled to a corresponding one of the constant current sources, the switch including an input for receiving the control signal and selectively completing an electrical circuit between the corresponding constant current source and an output of the programmable current source in response to the control signal.

8. The circuit of claim 7, wherein each of the constant current sources includes an input for receiving an enable signal and selectively activating the constant current source in response to the enable signal.

9. The circuit of claim 1, wherein the programmable current source further comprises:
   a plurality of drivers, each of the drivers including a data input for receiving a data signal representative of a state to be written into the selected memory cell, a current input operatively coupled to the output of the programmable current source for receiving the output current generated by the programmable current source, and an output operatively coupled to an end of a corresponding selected bit line, the driver being selectively configured to perform one of:
      (i) directing the output current received at the current input of the driver to the output of the driver in a current source mode of operation; and
      (ii) completing an electrical circuit between the output of the driver and a negative voltage supply in a current sink mode of operation;
   wherein the plurality of drivers selectively control a direction of current in the corresponding bit line associated with a selected memory cell.

10. A magnetic random access memory (MRAM) device comprising:
   a plurality of magnetic memory cells;
   a plurality of bit lines and word lines operatively coupled to the memory cells for selectively writing one or more of the memory cells;
   at least one field compensation circuit operatively coupled to the bit lines, the field compensation circuit including:
      a programmable current source operatively coupled to a bit line associated with a selected memory cell, the programmable current source including an input for receiving a control signal, the current source generating a write current having a magnitude which varies in response to the control signal; and
      a controller operatively connected to the programmable current source, the controller detecting a characteristic representative of a future interaction between a magnetic field emanating from the bit line associated with the selected memory cell and at least one stray magnetic field emanating from one or more bit lines associated with one or more memory cells in close relative proximity to the selected memory cell, the controller generating the control signal, the control signal being indicative of the detected characteristic.

11. The MRAM device of claim 10, wherein the magnetic field interaction is at least partially determined by a state to be written into the selected memory cell and states to be written into the one or more memory cells in close relative proximity to the selected memory cell.

12. The MRAM device of claim 10, wherein the detected characteristic is derived from states to be written into the selected memory cell and the one or more memory cells in close relative proximity to the selected memory cell.

13. The MRAM device of claim 10, wherein the magnitude of the write current generated by the programmable current source is one of at least:
   (i) a first value when the selected memory cell and a memory cell adjacent to the selected memory cell are to be written to a same state with respect to one another, the first value being less than a nominal write current value; and
   (ii) a second value when the selected memory cell and the memory cell adjacent to the selected memory cell are to be written to different states with respect to one another, the second value being greater than the nominal write current value.

14. The MRAM device of claim 10, wherein the magnitude of the write current generated by the programmable current source is one of at least:
   (i) a first value when the selected memory cell and two or more memory cells in close relative proximity to the selected memory cell are to be written to a same state with respect to one another, the first value being less than a nominal write current value;
   (ii) a second value when the selected memory cell and the memory cells in close relative proximity to the selected memory cell are to be written to different states with respect to one another, the second value being greater than the nominal write current value; and
   (iii) a third value when anticipated magnetic fields emanating from two or more bit lines associated with the corresponding memory cells in close relative proximity to the selected memory cell substantially cancel one another, the third value being substantially equal to the nominal write current value.

15. The MRAM device of claim 10, wherein the write current generated by the programmable current source is a nominal value when anticipated magnetic fields emanating from two or more bit lines associated with corresponding memory cells in close relative proximity to the selected memory cell substantially cancel one another, whereby the anticipated magnetic field interaction is substantially zero.

16. The MRAM device of claim 10, wherein the programmable current source comprises:
   a plurality of constant current sources, each of the constant current sources including an output and generating a predetermined current at the output; and
   at least one switch operatively coupled to a corresponding one of the constant current sources, the switch including an input for receiving the control signal and selectively completing an electrical circuit between the corresponding constant current source and an output of the programmable current source in response to the control signal.

17. The MRAM device of claim 16, wherein each of the constant current sources includes an input for receiving an enable signal and selectively activating the constant current source in response to the enable signal.

18. The MRAM device of claim 10, wherein the programmable current source further comprises:
   a plurality of drivers, each of the drivers including a data input for receiving a data signal representative of a state to be written into the selected memory cell, a current input operatively coupled to the output of the programmable current source for receiving the output current generated by the programmable current source, and an output operatively coupled to an end of a corresponding selected bit line, the driver being selectively configured to perform one of:
      (i) directing the output current received at the current input of the driver to the output of the driver in a current source mode of operation; and
      (ii) completing an electrical circuit between the output of the driver and a negative voltage supply in a current sink mode of operation;
   wherein the plurality of drivers selectively control a direction of current in the corresponding bit line associated with a selected memory cell.

19. A method of writing a plurality of magnetic memory cells in a magnetic random access memory device, the method comprising the steps of:

detecting a characteristic representative of an anticipated magnetic field interaction between a magnetic field emanating from a bit line associated with a selected memory cell and at least one stray magnetic field emanating from one or more bit lines associated with one or more memory cells in close relative proximity to the selected memory cell; and     adjusting at least a portion of a write current flowing through the bit line corresponding to the selected memory cell in response to the detected characteristic.

20. The method of claim 19, wherein the detected characteristic is a state to be written into the selected memory cell and the one or more memory cells in close relative proximity to the selected memory cell.

* * * * *